United States Patent
Fleury

(10) Patent No.: US 7,491,939 B2
(45) Date of Patent: Feb. 17, 2009

(54) PHOTOSENSITIVE SENSOR AND APPLICATIONS IN THE AUTOMOTIVE FIELD

(75) Inventor: Benoist Fleury, Vincennes (FR)

(73) Assignee: Valeo Vision, Bobigny (FR)

( * ) Notice: Subject to any disclaimer, the term of this patent is extended or adjusted under 35 U.S.C. 154(b) by 155 days.

(21) Appl. No.: 11/401,161

(22) Filed: Apr. 10, 2006

(65) Prior Publication Data

US 2006/0226365 A1    Oct. 12, 2006

(30) Foreign Application Priority Data

Apr. 11, 2005    (FR) ................................... 05 03580

(51) Int. Cl.
*G01J 5/02* (2006.01)
(52) U.S. Cl. ............... 250/339.05; 250/338.1; 356/51; 359/885
(58) Field of Classification Search ............ 250/338.1, 250/338.4, 339.01, 339.05; 356/51; 359/885

See application file for complete search history.

(56) References Cited

U.S. PATENT DOCUMENTS

| | | | |
|---|---|---|---|
| 4,651,001 A | 3/1987 | Hrada et al. | |
| 4,663,656 A | 5/1987 | Elabd et al. | |
| 5,701,008 A * | 12/1997 | Ray et al. | ................... 250/352 |
| 5,801,373 A | 9/1998 | Oozu et al. | |
| 6,831,261 B2 | 12/2004 | Schofield et al. | |
| 2002/0003571 A1 * | 1/2002 | Schofield et al. | ............ 348/148 |
| 2003/0001093 A1 | 1/2003 | Wood | |
| 2004/0195508 A1 * | 10/2004 | Moisel | ....................... 250/330 |
| 2005/0218328 A1 * | 10/2005 | Suzuki et al. | ................ 250/353 |

OTHER PUBLICATIONS

"Artificail Apposition Compound Eye Fabricated by Micro-Optics Technology," Duparre et al., Applied Optics, vol. 43, No. 22, Aug. 1, 2004.

* cited by examiner

*Primary Examiner*—David P Porta
*Assistant Examiner*—Casey Bryant
(74) *Attorney, Agent, or Firm*—Jacox, Meckstroth & Jenkins

(57) ABSTRACT

The invention concerns a sensor that is photosensitive vis-à-vis at least part of the radiation in the infrared range and at least part of the radiation in the visible range. This sensor is provided with a filter affecting all or part of a receiving zone of the sensor and able to filter radiation in the wavelengths to which the sensor is sensitive according to a filtering level that varies locally.

41 Claims, 3 Drawing Sheets

PHOTOSENSITIVE SENSOR AND APPLICATIONS IN THE AUTOMOTIVE FIELD

FIELD OF THE INVENTION

The present invention concerns sensors, for example of the CCD sensor type (Charge Coupling Sensors), CMOS (Complementary Metal Oxide Semiconductor) sensors or of the video camera type. These sensors or camera will be grouped together in the remainder of the present text under the generic term photosensitive sensors. They supply signals representing images that can then be processed. They are generally sensitive in the visible and/or infrared range, in particular in the near infrared.

BACKGROUND OF THE INVENTION

This type of photosensitive sensor is being integrated more and more frequently in motor vehicles. The images obtained can be processed in order to display images on screens, for example at the dashboard or projected on the windscreen, in particular to alert the driver in the case of danger or simply to improve his visibility. They can also participate in the automatic triggering of a functionality of the vehicle (automatic triggering of braking, visual or audible warning, control of certain functions of the headlight, etc). These sensors can be used by day. They can also be used at night, and then their capacities for detecting radiation in the infrared range are rather exploited. In nocturnal use, these sensors thus participate for example in the "night vision" functionality, where the images, once processed, are projected onto a display screen generally in the form of black and white images.

However, it can scarcely be envisaged using as it stands the same sensor installed on a vehicle in daytime use and in nocturnal use, even if in principle it may be capable of detecting in both the visible and infrared ranges. This is because, if a sensor sensitive to infrared is used so that it can "see" at night, by day the reflection of the sun on the road in the areas close to the vehicle will easily cause saturation of it in the infrared: this saturation tends to make it inappropriate for daytime use, with a loss of quality of the images contained. (In the present text the word image will be used in the broad sense, namely any signal or set of signals received or restored by the photosensitive sensor.)

In order to have images of the required quality with these types of sensor both by day and by night and whatever the sunshine, there have up to the present time been two solutions.

The first solution consists of using two sensors, a first sensor dedicated to daytime use and equipped with a filter "cutting" the infrared in order to avoid any saturation in the case of sunshine and a second sensor dedicated to nocturnal use. The drawback of this first solution is that two sensors are required, which increases the cost, complexity and size of the system using the images collected by the sensors.

The second solution consists of using a single sensor, and equipping it with a removable filter able to filter the infrared: in daytime use with strong sunshine, the filter is active and prevents the saturation of the sensor with infrared. On the other hand, the filter is removed in nocturnal use and in daytime use with weak sunshine. This solution is also not devoid of drawbacks: providing a movable part in a sensor is complex and presents a risk of malfunctioning. In addition, it is necessary to provide means for detecting the day/night/degree of sunshine environmental conditions, means that are complex, expensive and liable to failure.

The aim of the invention is therefore to remedy the drawbacks of the existing solutions. More precisely, the aim of the invention is to develop novel photosensitive sensors able to provide a satisfactory image quality both by day and by night, and which are in particular simpler and/or more reliable.

SUMMARY OF THE INVENTION

An object of the invention is first of all a sensor that is photosensitive vis-à-vis at least part of the radiation in the infrared range and at least part of the radiation in the visible range, such that the sensor is provided with a filter affecting all or part of the receiving zone of the sensor enabled to filter radiation in the wavelengths to which the sensor is sensitive according to a filtering level which varies locally.

Another object of the invention is a sensor that is photosensitive vis-à-vis at least part of the radiation in the infrared range and at least part of the radiation in the visible range, such that the sensor is provided with a filter able to filter radiation in the wavelengths to which the sensor is sensitive, this filter affecting only part of the receiving zone of the sensor.

The filter is advantageously chosen to filter the near infrared.

With its two alternative or cumulative variants, the invention has made it possible to ingeniously resolve the problem posed. This is because, by day, a significant part of the infrared received by the sensor comes from the reflection diffusing on the road the infrared emitted by the sun, close to the front of the vehicle, the sensor generally being disposed on a substantially vertical plane, for example in the vehicle scuttle or in the cabin close to the windscreen. And this reflected infrared part, liable to saturate the sensor with infrared, tends to reach only part of its receiving zone, the lowest zone particularly in the normal configuration of the sensor. The invention has then used this observation in proposing a filter that locally modulates its filtration effort vis-à-vis nuisance radiation, in particular the infrared, especially in the near infrared. Thus, at night, sufficient infrared is allowed to reach the sensor in order to obtain an image of sufficient quality. And by day, in strong sunshine, the filter removes sufficient infrared from the radiation received by the sensor to prevent saturation thereof in the zones where the risk of saturation is the greatest, whilst keeping a satisfactory image quality.

This thus gives a unique night-time/daytime sensor, without any moving part and whose performance remains good whatever the level of sunshine by day. There is of course a gain in terms of simplicity of installation of this sensor, in terms of simplicity of integration in an image processing system, in terms of cost, and in terms of reliability of functioning of the sensor, which has no moving parts. It might however have been feared that such a choice would result in a poor compromise in terms of performance, with a sensor giving images that are too degraded at night and by day when there is weak sunshine, but surprisingly this has not proved to be the case.

In the second variant in particular, the filter can have a degree of filtering of the radiation which is uniform or which varies locally.

Advantageously, the sensor receiving zone is disposed, in the position of use, in a substantially vertical or oblique plane and the filter affects a part of the receiving zone situated at the bottom part or at the top part of the said zone, that is to say the zone that corresponds to the bottom part of the object or scene. The terms "object" and "scene" are understood in their normal sense in the field of cameras and sensors. This is because, according to the train of optical means of the lens type used as a lens associated with a sensor, there is either a match between the bottom of the scene and the bottom of the receiving zone, or a reversal, the bottom of the scene then corresponding to the top of the receiving zone of the sensor. Hereinafter, for more convenience, it can be considered that the bottom of the receiving zone corresponds to the bottom of the scene, according in particular to the train of lenses for forming the image, but this does not have a limiting character.

As briefly explained above it is in fact in the lowest part of the sensor (or the highest part according to the type of lens, as mentioned previously) that the intensity of the infrared radiation emitted by the sun and re-emitted by the road at a short distance from the vehicle will be the greatest (taking the convention that the terms high, low, bottom, top relate to the sensor placed in its configuration of use in particular once mounted in the vehicle, in a lens without image inversion).

Many embodiments are possible, from the most simple to the most sophisticated. It is possible to have a substantially vertical and substantially square or rectangular receiving zone, with a filtered bottom (or respectively top) zone and a non-filtered top (or respectively bottom) zone, with a separation line between the two zones which is a simple substantially horizontal straight line joining the two opposite edges of the receiving zone. It is also possible to have a separation line which is not rectilinear, but which may be curved.

It is also possible to have a mosaic of several filtered zones and one or more non-filtered zones. It is possible to provide filtered zones at different levels which are contiguous or separated from one another by non-filtered zones, or filtered zones with identical filtration levels and separated by one or more non-filtered zones. The filtered zones can have different filtration levels, gradual for example, with several superimposed zones more and more filtered from the top towards the bottom. It is also possible to have an entirely filtered receiving zone, with a degree of filtering for example that is extremely low at the top and stronger and stronger towards the bottom. It is also possible to have zones whose degree of filtering varies not only from top to bottom but for example from the edges towards the middle part of the receiving zone.

It can thus be seen that it is possible to implement the invention in a very varied fashion, according in particular to the position of the sensor in the vehicle, its sizing, the climate of the country where the vehicle is intended to travel, the requirements on the quality of the night-time images, etc.

Advantageously, the sensor receiving zone is disposed, in the position of use, in a substantially vertical or oblique plane, and the filter affects at least the lower (or respectively upper) quarter or third of the height of the receiving zone. For example, the filter can affect at least 25%, in particular at least 30% or at least 50%, of the surface of the receiving zone. It can also affect no more than 65%, in particular no more than 60% or no more than 50%, of the surface of the sensor receiving zone.

According to one embodiment, the filter affects substantially all the surface of the sensor receiving zone with a gradual degree of filtering according to the height of the receiving zone (from bottom to top or vice versa), in the position of use of the sensor.

Concerning the practical embodiment of the filter according to the invention, it is possible for example to use a screen of the substrate type (glass, plastics or any other material transparent in the visible range and in the near infrared) provided with at least one thin film of the filtering interferential type or a filtering lacquer or provided with additives/self-coloured. In the variant where the filter affects only part of the receiving zone of the sensor, it is possible to choose to use this type of screen with appropriate sizings so as to have an impact only on part of the receiving zone. To facilitate the manufacture or mounting of the filter and to prevent any risk of loss of image quality between the filtered zone and the non-filtered zone, it may also be preferred to use a filter that consists of a screen which has a neutral part—the bare substrate—non- or substantially non-filtering, and one or more other filtering parts—the substrate provided with thin film or films or a lacquer or additives—and therefore active vis-à-vis corresponding receiving zones on the sensor.

In order to obtain a screen which has various filtering levels, it is possible to provide it with at least two zones provided with a thin film or films of different natures and/or numbers and/or thickness. The thin film deposition device, of the cathodic sputtering type, for example, make it possible to very precisely regulate the surface, the thickness of each film and the sequence of films in a stack of films.

The filter is preferably disposed on or close to the receiving zone of the sensor, or is disposed on or close to an intermediate image plane of the sensor or is disposed beyond the lens associated with the sensor.

The sensor according to the invention is perfectly integrated in a night vision function of a motor vehicle.

Another object of the invention is the image processing device installed on a motor vehicle using at least the sensor described above.

Another object of the invention is the image processing method using the signals received by the sensor installed on a motor vehicle described above.

Finally, another object of the invention is a motor vehicle provided with such a sensor.

The invention will be detailed below with non-limiting examples, with the help of the following figures:

DESCRIPTION OF THE PREFERRED EMBODIMENTS

Figure 1:
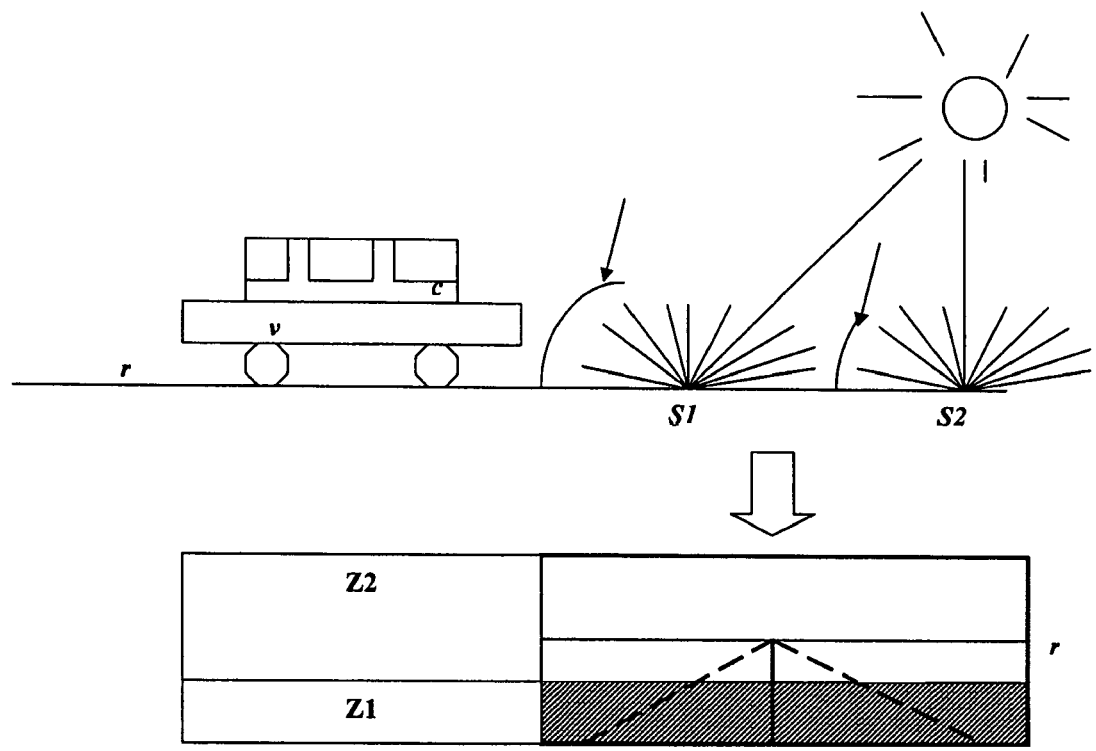
FIG. 1 is a schematic representation of a vehicle on the road provided with a sensor according to the invention.

FIG. 1 depicts, highly schematically and not to scale for more clarity, a road r on which a vehicle v is travelling. This vehicle is equipped with a sensor c photosensitive vis-à-vis the visible and near infrared ranges and disposed behind the windscreen. By day, in the case of strong sunshine, the sun emits a large amount of radiation in the near infrared in the direction of the road. Infrared rays are then reflected, in a diffusing fashion, by the road. Those that are reflected in a zone s1 close to the vehicle (up to for example 30 meters in front of the vehicle) will reach the receiving zone of the sensor c with a fairly great intensity, whilst the rays reflected at a greater distance to the front of the vehicle (for example beyond 30 meters in front of the vehicle), in the zone s2 will affect the sensor only a little, which is shown by the representation, at the bottom of FIG. 1, of the road in front of the vehicle. In the daytime, the large quantity of infrared emitted by the sun and then reflected by the road may saturate the sensor without a filter. Then an image with a loss of information, and therefore a mediocre image, is obtained. If, in order to deal with this drawback, the sensor is provided with a filter F (FIG. 4A) which will filter infrared, the sensor c become unusable at night.

Figure 2:
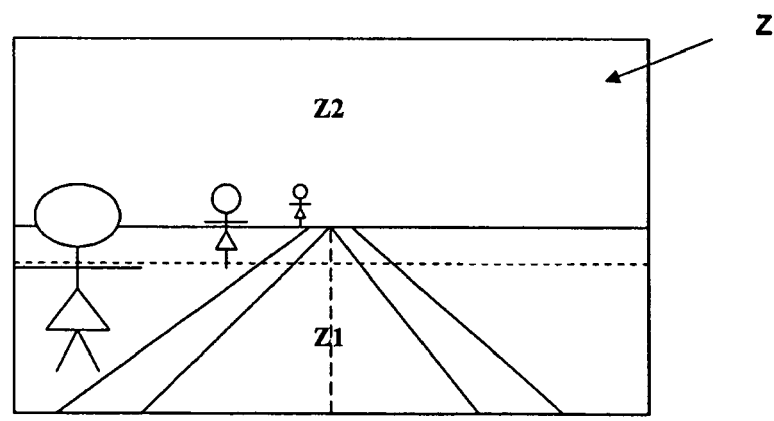
FIG. 2 is a schematic representation of the field of vision of the sensor of FIG. 1 with a first filter.
Figure 3:
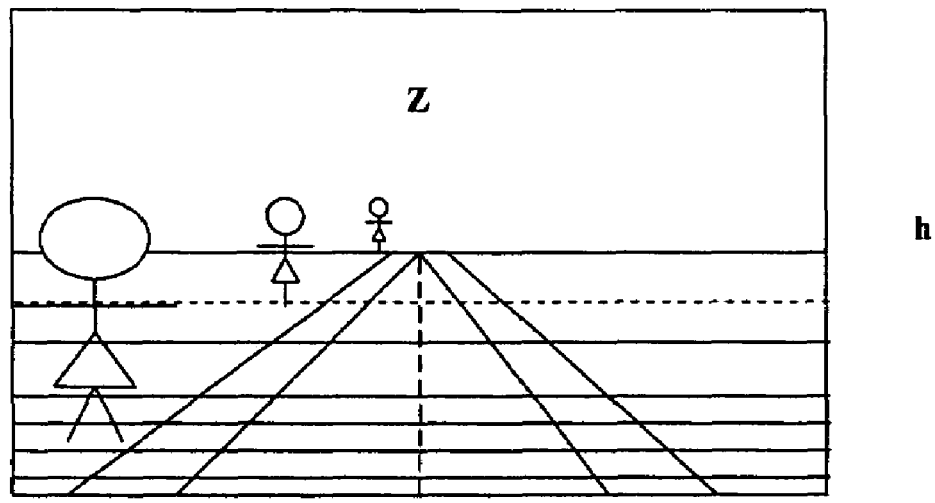
FIG. 3 is a schematic representation of the field of vision of the sensor of FIG. 1 with a second filter.

The invention has therefore exploited this observation in order to design a sensor which can function both by day and by night, by developing a novel type of sensor:

FIG. 2 depicts the "field of vision" of the sensor provided with a first type of filter, matching its receiving surface Z (FIG. 3). The filter F is placed in front of the receiving zone of the sensor so as to filter the infrared selectively: if schematically the receiving zone Z of the sensor is represented by a rectangle, this surface is divided into two: a zone Z2 (FIGS. 1 and 2) with no filter, which corresponds to approximately the top half of the rectangle, and a zone Z1 provided with a filtering at least partially filtering the near infrared, corresponding to a surface complementary to Z2. It is possible to choose in the zone Z1 a constant or gradual filtration according to the height h (FIG. 3) of the receiving zone Z. The degree of filtration of the near infrared, if it is constant, can for example be at least 70% or 80%. If it is gradual, it may for example be, at the lowest, 90% or 100%, and then gradually decrease so as, at the top of the zone Z1, to be 50% or 60% (or vice versa according to the lens associated with the sensor).

With the receiving zone 21 thus divided into two, the functioning of the sensor is greatly improved by day. This is because the zone Z1, which was the one most exposed to infrared saturation when the sun is there, is filtered, which precisely prevents its being saturated: it continues to correctly sense the visible range and possibly a little infrared if the degree of filtering is not 100%: it collects enough information to restore an image of sufficient quality, in combination with the non-filtered zone Z2.

By night, zone Z1 corresponds to a portion of the road illuminated by beams of the dipped type, emitted in the visible range by the vehicle headlights, whilst the zone Z2 corresponds to the scene illuminated by the infrared emitters of the vehicle if it is equipped with them. The zone Z2 is the zone which "sees" the furthest with respect to the vehicle, this zone is the most important, in particular for integration in a "night vision" function, since it will make it possible to detect obstacles in the distance, making it possible to anticipate any actions to be taken, for example anticipating braking manually or automatically.

In fact, this type of filtering allows functioning of the entire receiving zone by day without saturation of the image even in strong sunshine. And by night, it favors the most important receiving zone Z2 for the night vision sought, without it being to the detriment of the zone closer to the vehicle illuminated in the visible range by the headlights of the vehicle. In both cases, the image collected is of sufficient quality for the expected use of the sensor.

The filtering according to FIG. 2 is a simple design. The invention can then make provision for dividing the receiving zone Z2 not into two but into many more zones, some filtered, others not, or all filtered but with a degree of filtration that varies. In the majority of cases, however, there will be an advantage in locating the filtered zones towards the bottom of the receiving zone, that is to say in the zones which will be most subjected to the infrared radiation reflected by the road.

FIG. 3 thus presents a variant of the sensor according to FIG. 1, where the receiving zone Z is filtered gradually, in a linear or non-linear fashion, over its height h: at the "bottom", the degree of filtering is for example 90%, decreasing to 10% at the "top". This gradation of the filtering favors the retrieval of images with a more even resolution.

Figures 4A, 4B, 4C:
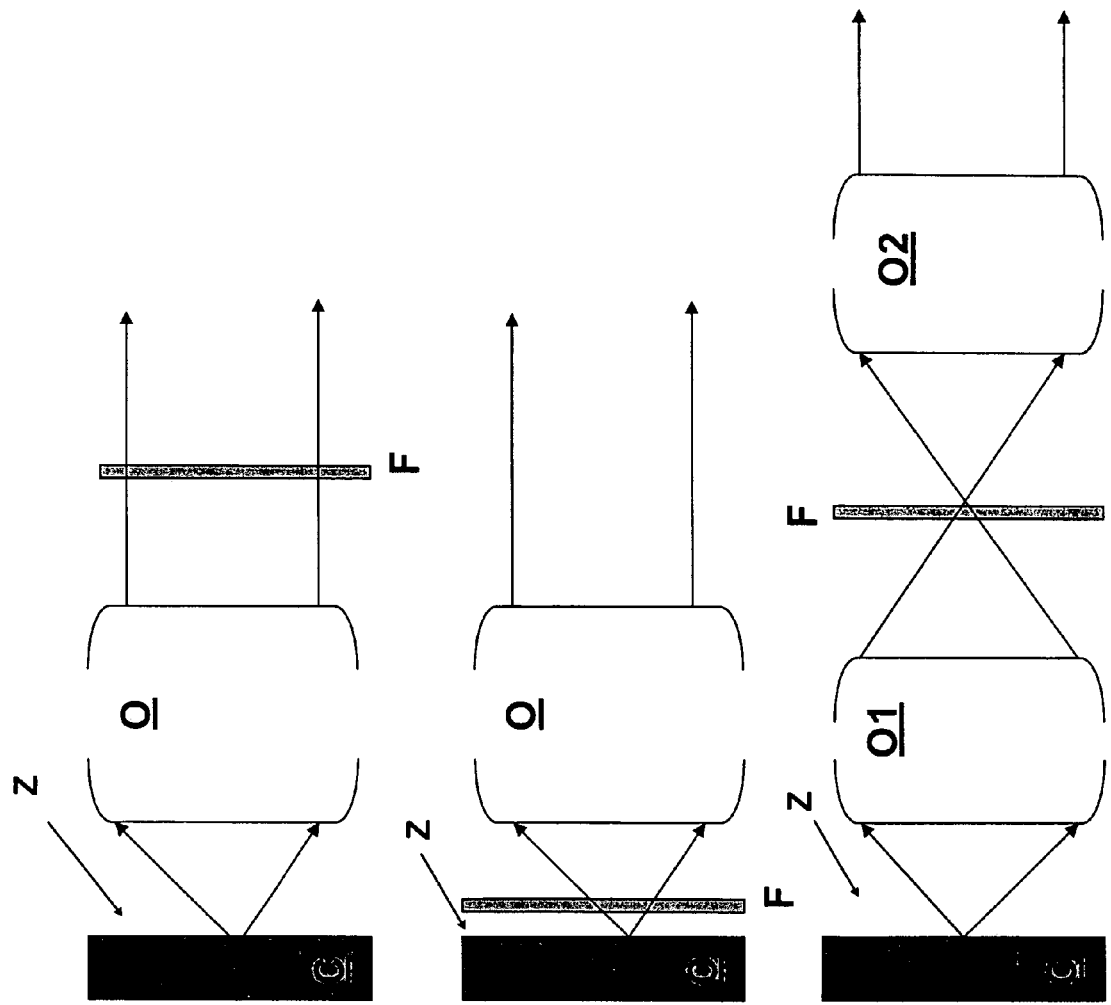
FIGS. 4A, 4B and 4C are schematic representation of different variants of a sensor according to the invention associated with a lens.

FIGS. 4A, 4B and 4C represent highly schematically a cross section of the sensors C provided according to the invention with filters and associated with lenses:

FIG. 4A depicts the receiving zone Z, and then the filter F, which is up against the zone Z and which constitutes a neutral substrate having high transmission in the visible range and in the infrared, for example made from clear glass, provided on its bottom half with a stack of appropriate interferential layers allowing, like the substrate, good transmission in the visible range, but highly filtering vis-à-vis the near infrared. The filter F can be contiguous with the sensor or be placed at a very short distance. Beyond the filter, a lens O is provided, composed of a train of lenses designed so that the image, as depicted by the arrows, is not inverted passing through it. This is the configuration used in the examples illustrated in the previous figures. Such a filter disposed in front of the receiving zone makes it possible to obtain a selective filtering effect according to FIG. 2. Having a filter with a neutral zone can facilitate its mounting in the sensor and improve the quality of the image in the transition zone. A variant consists of keeping only the zone F of the filter provided interferential layers "facing" the zone Z1. In order to obtain the gradual filtering according to FIG. 3, the filter F is for example adapted by providing an increasing thickness of filtering layer or layers.

FIG. 4B is a variant of the previous one: the filter F is disposed beyond the lens O, repeating the references in FIG. 4A.

FIG. 4C is another variant: here the filter F is disposed in the intermediate image plane of the lens divided into two trains of lenses O1 and O2. The arrows indicate the image inversion in the plane of the filter F.

Figure 5A:
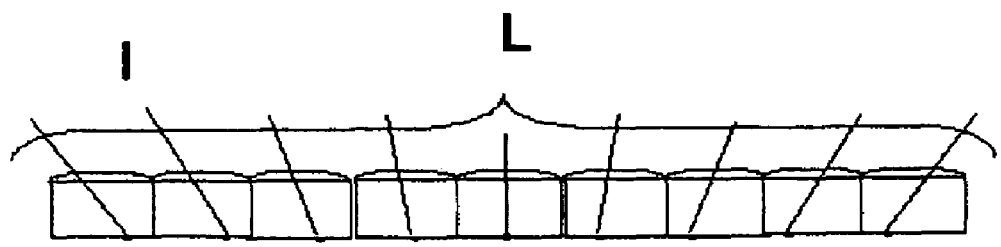
FIGS. 5A and 5B are schematic representations of a particular lens associated with the sensor according to FIGS. 4A, 4B, 4C.

According to yet another variant, the lens can contain optical means obtained by micro-optic techniques, as depicted in FIG. 5. The lens O, in particular in any of the configurations depicted in FIGS. 4A, 4B and 4C, can optionally comprise an optical means, here a lens L, comprising a plurality of microlenses I. These microlenses can be substantially identical and have the same focal distance, as shown in FIG. 5A, or not.

A lens of this type is described in the article "Artificial apposition compound fabricated by micro-optics technology" by Jacque Duparré et al, published in Applied Optics Volume 43 No 22, 1 Aug. 2004.

An anamorphic lens is then spoken of. The microlenses are arranged, for example, at a constant step and are associated with pixels of the image sensor also arranged at a constant step. The step of the pixels is less than the step of the microlenses so that the pixel in question sees an angle of field that is larger and larger as the pixel moves away from the axis of the lens.

Figure 5B:
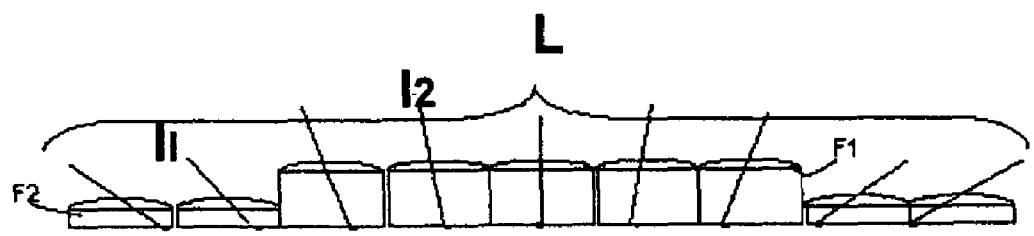

According to another embodiment, depicted in FIG. 5B, the lens L still comprise a plurality of microlenses but distributed in two different types I1 and I2, having different focal distances F1, F2. Advantageously, it is chosen to associate this lens L with a sensor C whose pixels have a step that is constant but different from that of the microlenses I1 and I2. The step of the pixels is preferably less than the step of the microlenses.

With this microlens technology, it is thus possible to obtain different angular resolutions for the central zone and lateral zones of the scene. The resolution of the image can vary in steps or gradually, in particular by a variation corresponding to the step of the pixels or microlenses.

The invention thus finds an application in the automotive field, but is also applicable in any other field where there is a need for a sensor that is effective both by day and by night, in particular for equipping any aerial, terrestrial or maritime locomotion means.

The invention resides in particular in the fact that, for a preferred embodiment, the receiving zone of the sensor C comprises a dividing line between a first zone (above this line)

where there is a need for infrared radiation, all the pixels concerned being sensitised vis-à-vis infrared, and another zone (below this line) where it is necessary on the contrary to filter the infrared radiation, the pixels concerned being sensitised vis-à-vis visible radiation.

The multifunctionality of the sensor according to the invention is a great asset: it is thus possible to integrate it either in a system of the night-vision type, or in a system of the LDWS (in English "Lane Departure Warning Signal", or in French unintentional lane departure warning) type or in a system for the automatic switching of the headlights from one lighting mode to another, from a "main beam" mode to a "dipped" mode in particular.

What is claimed is:

1. A sensor photosensitive in relation to at least part of the radiation in the infrared and at least part of the radiation in the visible range, wherein the sensor comprises a filter affecting all or part of a receiving zone of the sensor and able to filter radiation in wavelengths to which the sensor is sensitive according to a degree of filtering that varies locally;
    wherein said receiving zone comprises a plurality of zones, said filter providing infrared filtering of different levels to said plurality of zones;
    wherein said filter filters only a top portion or a bottom portion of said receiving zone, which corresponds to a bottom part of the object or scene.

2. The sensor according to claim 1, wherein said filter filters radiation in the infrared, radiation in the near infrared.

3. The sensor according to claim 1, wherein said filter has a degree of filtering of the radiation that is uniform or varies locally.

4. The sensor according to claim 1, wherein said receiving zone of the sensor is disposed, in the position of use, in a substantially vertical or oblique plane, and in that the filter affects a part of the receiving zone, situated at the bottom or top part of the receiving zone, which corresponds to a bottom part of the object or scene.

5. The sensor according to claim 4, wherein said receiving zone of the sensor is disposed, in the position of use, in a substantially vertical or oblique plane, and in that the filter affects at least the bottom or top quarter or third of the height of the receiving zone.

6. The sensor according to claim 1, wherein said filter affects at least, in particular at least 30% or at least 50%, of the surface of the receiving zone.

7. The sensor according to claim 1, wherein said filter affects no more than 65%, no more than 60% or no more than 50%, of the surface of the receiving zone.

8. The sensor according to claim 1, wherein said filter has a substrate provided with at least one thin film of the interferential type or a lacquer or which is self-filtering.

9. The sensor according to claim 1, wherein said filter has a substrate comprising at least one active zone provided with a thin film or films of the interferential type or a lacquer or coating or at least one neutral zone with no thin films or lacquer or coating.

10. The sensor according to claim 9, wherein said receiving zone has at least two zones provided with a thin film or films or lacquer or coating with different natures and/or numbers and/or thicknesses.

11. The sensor according to claim 1, wherein said filter is disposed on or close to the sensor, or in or close to an intermediate image plane of the said sensor.

12. The sensor according to claim 1, which is associated with a lens comprising an optical means of the lens type provided with a plurality of microlenses with constant or variable step and/or focal distance.

13. The sensor according to claim 1, which is incorporated in a motor vehicle.

14. The sensor according to claim 1, which serves as a daytime or night-time sensor.

15. The sensor according to claim 1, which is integrated in a night vision function of a motor vehicle.

16. Image processing device installed on a motor vehicle, which uses at least one sensor according to claim 1.

17. Image processing method, which uses the signals received by a sensor installed on a motor vehicle according to claim 1.

18. A motor vehicle, which is provided with the sensor according to claim 1.

19. A sensor photosensitive in relation to at least part of the radiation in the infrared and at least part of the radiation in the visible range, wherein the sensor comprises a filter affecting all or part of a receiving zone of the sensor and able to filter radiation in wavelengths to which the sensor is sensitive according to a degree of filtering that varies locally;
    wherein said filter affects substantially all the surface of said receiving zone of the sensor, with a degree of filtering that is gradual according to the height of the receiving zone, in the position of use of the sensor.

20. A vehicle image system for use on a vehicle, said vehicle image system comprising:
    a sensor comprising a receiving zone capable of sensing, at least in part, radiation in the infrared and, at least in part, radiation in the visible range; and
    a filter associated with said sensor for filtering at least a portion of said receiving zone, said filter removing sufficient infrared radiation to facilitate preventing saturation of at least a portion of said receiving zone during the day and, at night, said receiving zone captures sufficient infrared, thereby enabling said sensor to obtain an image of a desired quality during the day and at night;
    wherein said filter filters only a bottom portion of said receiving zone.

21. The vehicle image system as recited in claim 20 wherein said sensor is situated in a vertical or oblique plane.

22. A vehicle image system for use on a vehicle, said vehicle image system comprising:
    a sensor comprising a receiving zone capable of sensing, at least in part, radiation in the infrared and, at least in part, radiation in the visible range; and
    a filter associated with said sensor for filtering at least a portion of said receiving zone, said filter removing sufficient infrared radiation to facilitate preventing saturation of at least a portion of said receiving zone during the day and, at night, said receiving zone captures sufficient infrared, thereby enabling said sensor to obtain an image of a desired quality during the day and at night;
    wherein said sensor is situated in a vertical or oblique plane;
    wherein said filter filters only a bottom portion of said receiving zone.

23. The vehicle image system as recited in claim 22 wherein said filter provides a gradual degree of filtering of said receiving zone.

24. The vehicle image system as recited in claim 22 wherein said filter filters substantially all of said receiving zone.

25. The vehicle image system as recited in claim 22 wherein said filter comprises a substrate that comprises at least one thin film or a lacquer.

26. A vehicle image system for use on a vehicle, said vehicle image system comprising:
- a sensor comprising a receiving zone capable of sensing, at least in part, radiation in the infrared and, at least in part, radiation in the visible range; and
- a filter associated with said sensor for filtering at least a portion of said receiving zone, said filter removing sufficient infrared radiation to facilitate preventing saturation of at least a portion of said receiving zone during the day and, at night, said receiving zone captures sufficient infrared, thereby enabling said sensor to obtain an image of a desired quality during the day and at night;
- wherein said receiving zone comprises a plurality of zones, said filter providing infrared filtering of different levels to said plurality of zones;
- wherein said filter filters only a top portion or a bottom portion of said receiving zone, which corresponds to a bottom part of the object or scene.

27. The vehicle image system as recited in claim 26 wherein said filter comprises a substrate that comprises at least one thin film or a lacquer.

28. The vehicle image system as recited in claim 26 wherein said vehicle image system further comprises at least one lens situated adjacent said filter.

29. The vehicle image system as recited in claim 28 wherein said at least one lens comprises a plurality of microlenses.

30. The vehicle image system as recited in claim 26 wherein said filter filters infrared in the near infrared.

31. The vehicle image system as recited in claim 26 wherein said sensor generates signals for receipt and use by at least one of a night vision system, a lane departure warning system, or an automatic headlight switching system in said vehicle, respectively.

32. A vehicle image system for use on a vehicle, said vehicle image system comprising:
- a sensor comprising a receiving zone capable of sensing, at least in part, radiation in the infrared and, at least in part, radiation in the visible range; and
- a filter associated with said sensor for filtering at least a portion of said receiving zone, said filter removing sufficient infrared radiation to facilitate preventing saturation of at least a portion of said receiving zone during the day and, at night, said receiving zone captures sufficient infrared, thereby enabling said sensor to obtain an image of a desired quality during the day and at night;
- wherein said filter filters less than sixty percent of said receiving zone;
- wherein said filter filters only a top portion or a bottom portion of said receiving zone, which corresponds to a bottom part of the object or scene.

33. A method for facilitating control of a vehicle by capturing images of a desired quality during the day and at night using a sensor having a receiving zone, said method comprising the steps of:
- filtering at least a first portion of said receiving zone with a filter to remove sufficient infrared radiation to facilitate preventing saturation of said at least a first portion of said receiving zone while capturing a first image during the day, wherein said receiving zone comprises a plurality of zones, said filter providing infrared filtering of different levels to said plurality of zones;
- enabling at least a second portion of said receiving zone to capture sufficient infrared at night to obtain a second image of sufficient quality; and
- using signals generated by said sensor and corresponding to said first and second images to facilitate controlling the operation of the vehicle by an operator or to trigger a functionality during the day and at night;
- wherein said filter filters only a top portion or a bottom portion of said receiving zone, which corresponds to a bottom part of the object or scene.

34. The method as recited in claim 33 wherein said at least one first portion corresponds to a bottom portion of said receiving zone.

35. The method as recited in claim 33 wherein said sensor is situated in a vertical or oblique plane.

36. A method for facilitating control of a vehicle by capturing images of a desired quality during the day and at night using a sensor having a receiving zone, said method comprising the steps of:
- filtering at least a first portion of said receiving zone with a filter to remove sufficient infrared radiation to facilitate preventing saturation of said at least a first portion of said receiving zone while capturing a first image during the day;
- enabling at least a second portion of said receiving zone to capture sufficient infrared at night to obtain a second image of sufficient quality; and
- using signals generated by said sensor and corresponding to said first and second images to facilitate controlling the operation of the vehicle by an operator or to trigger a functionality during the day and at night;
- wherein said at least a first and second portions of said receiving zone are different;
- wherein said filter filters only a top portion or a bottom portion of said receiving zone, which corresponds to a bottom part of the object or scene.

37. A method for facilitating control of a vehicle by capturing images of a desired quality during the day and at night using a sensor having a receiving zone, said method comprising the steps of:
- filtering at least a first portion of said receiving zone with a filter to remove sufficient infrared radiation to facilitate preventing saturation of said at least a first portion of said receiving zone while capturing a first image during the day;
- enabling at least a second portion of said receiving zone to capture sufficient infrared at night to obtain a second image of sufficient quality; and
- using signals generated by said sensor and corresponding to said first and second images to facilitate controlling the operation of the vehicle by an operator or to trigger a functionality during the day and at night;
- wherein said method further comprises the step of filtering only a bottom portion of said receiving zone.

38. The method as recited in claim 37 wherein said method further comprises the step of gradually filtering said receiving zone.

39. The method as recited in claim 37 wherein said method further comprises the step of filtering substantially all of said receiving zone.

40. The method as recited in claim 37 wherein said filter comprises a substrate that comprises at least one thin film or a lacquer.

41. The method as recited in claim 37 wherein the method further comprises the step of:
- coupling said sensor to at least one of a night vision system, a lane departure warning system, or an automatic headlight switching system in said vehicle;
- using signals generated by said sensor to control at least one of said night vision system, said lane departure warning system, or said automatic headlight switching system in said vehicle, respectively.

* * * * *